United States Patent
Bass et al.

[11] Patent Number: 6,019,098
[45] Date of Patent: *Feb. 1, 2000

[54] SELF POWERED FURNACE

[75] Inventors: John C. Bass; Daniel T. Allen, both of La Jolla, Calif.

[73] Assignee: Hi-Z Technology, Inc., San Diego, Calif.

[*] Notice: This patent is subject to a terminal disclaimer.

[21] Appl. No.: 09/009,045

[22] Filed: Jan. 20, 1998

Related U.S. Application Data

[63] Continuation-in-part of application No. 08/650,299, May 20, 1996, Pat. No. 5,892,656, which is a continuation-in-part of application No. 08/139,311, Oct. 19, 1993, Pat. No. 5,625,245, and application No. 08/417,676, Apr. 6, 1995, abandoned.

[51] Int. Cl.$^7$ .................................................... F24H 9/00
[52] U.S. Cl. ............................................................ 126/344
[58] Field of Search ........................ 126/344, 93, 350 R; 310/306, 303

[56] References Cited

U.S. PATENT DOCUMENTS

| | | | |
|---|---|---|---|
| 2,519,241 | 8/1950 | Findley | 126/93 |
| 3,185,201 | 5/1965 | Herbst et al. | 126/110 E |
| 4,611,089 | 9/1986 | Elsner et al. | 136/230 |
| 4,843,273 | 6/1989 | Dammers et al. | 126/110 B |
| 5,495,829 | 3/1996 | Jayaraman et al. | 126/110 R |
| 5,625,245 | 4/1997 | Bass | 310/306 |
| 5,856,210 | 1/1999 | Leavitt et al. | 438/55 |
| 5,875,098 | 2/1999 | Leavitt et al. | 361/708 |

FOREIGN PATENT DOCUMENTS

3148162  6/1983  Germany.

*Primary Examiner*—Ira S. Lazarus
*Assistant Examiner*—Sara Clarke
*Attorney, Agent, or Firm*—John R. Ross; John R. Ross, III

[57] ABSTRACT

A self-powered combustion furnace unit. A combustion furnace providing circulating hot fluid heating is equipped with a thermoelectric generator comprised of a plurality of thermoelectric modules mounted on the furnace. The heat from the combustion provides a high temperature hot side heat source for the thermoelectric modules and the fluid of the circulating hot fuid system provides the cold side heat sink for the thermoelectric modules. Electric power produced by the thermoelectric modules powers a motor driving a pump which circulates the circulating hot fluid. In a preferred embodiment low cost, high temperature thermoelectric modules are provided which comprise thermoelectric elements installed in injection molded eggcrates. The thermoelectric modules are held in close contact with the hot side heat exchanger and the cold side heat sink with a spring force such as that provided by Belville springs. The eggcrate is molded from a high temperature plastic with ridges provided for extra strength and tapered walls to permit ease of installation of the thermoelectric elements and stop tabs assure correct positioning of the elements. Electrical connections at hot and cold surfaces of the modules are preferably made by thermal spraying metallized coatings on the surfaces and then surface finishing the module to expose the walls of the eggcrate.

19 Claims, 11 Drawing Sheets

SELF POWERED FURNACE

This invention relates to self powered combustion heating units and in particular to such units which utilize thermoelectric generators. This invention is a continuation-in-part application of Ser. No. 08/650,299, filed May 20, 1996 (now U.S. Pat. No. 5,892,656, issued Apr. 6, 1999) which was a continuation in part of Ser. No. 08/139,311 filed Oct. 19, 1993 (now U.S. Pat. No. 5,625,245, issued Apr. 29, 1997) and Ser. No. 08/417,676 filed Apr. 6, 1995 (now abandoned).

BACKGROUND OF THE INVENTION

A self-powered central heating unit is one that operates entirely on combustion fuel, independently from the electrical grid. Such a system would in theory be more reliable in providing heat through extreme weather conditions. It would also find application in remote habitations not served by the electrical grid. However, the main obstacle to integrating an electric generator into a heating unit is the selection of a convenient, cost-effective engine and generator. Self-powered central space heating with forced air has been demonstrated utilizing expensive lead-telluride based thermoelectric devices. However, these devices have not been commercially successful. These devices are very inefficient and expensive and operate at a relatively low maximum hot side temperature of about 500 degrees F.

Thermoelectric devices are well known. These devices utilize physics principale known as the Seebeck effect discovered in 1821 and the Peltier effect discovered in 1834. The Seebeck principle tells us that if two wires of different materials (such as copper and iron) are joined at their ends, forming two junctions, and one junction is held at a higher temperature than the other junction, a voltage difference will arise between the two junctions. The Peltier effect describes an inverse effect. If current is sent through a circuit made of dissimilar materials, heat will be absorbed at one junction and given up or evolved at the other junction.

Most thermoelectric devices currently in use today to generate electricity or for cooling utilize semiconductor materials (such as bismuth telluride) which are good conductors of electricity but poor conductors of heat. These semiconductors are typically heavily doped to create an excess of electrons (n-type) or a deficiency of electrons (p-type). An n-type semiconductor will develop a negative charge on the cold side and a p-type semiconductor will develop a positive charge on the cold side.

Since each element of a semiconductor thermoelectric device will produce only a few millivolts it is generally useful to arrange the elements in series so as to produce higher voltages for the generation of electricity or to permit use of higher voltages for cooling. Several techniques have been developed for arranging the semiconductor elements in series in thermoelectric devices. In one such prior art method p and n type semiconductors are arranged in a checkerboard pattern and electrical jumpers are soldered, each to two different semiconductors, at the cold side and at the hot side so as to place all of the semiconductor elements in series with each other. This method is a low cost method and well established but has some limitations. Above 100 C the solders can defuse into the thermoelectric elements destroying them. In a high humidity atmosphere moisture may condense in the spaces between the elements and thermally short the module. The structure is not mechanically strong and easily fractures.

Another currently used method is the so-called eggcrate design. Here an "eggcrate" made of insulator material separates the thermoelectric elements and permits electrical jumpers to be pressed against the elements to provide a good electrical connection without solder. In prior art designs, the eggcrates are fabricated from individual walls which have been cut to shape using a precision laser cutter. All of the elements can be connected in series by proper construction of the eggcrate. Obviously it is possible in both devices to arrange for any desired number of elements to be in series. Thus, several elements in series may form a series set and this set could be arranged in parallel with other similar sets.

Prior art thermoelectric generators are expensive due primarily to labor costs to assemble the eggcrates to install the elements in the crates and to form the modules into a generator unit. What is needed is a lower cost thermoelectric generator.

What is needed is a better more efficient, cheaper, higher temperature self-powered central home heating unit.

SUMMARY OF THE INVENTION

The present invention provides a self-powered combustion furnace unit. A combustion furnace providing circulating hot fluid heating is equipped with a thermoelectric generator comprised of a plurality of thermoelectric modules mounted on the furnace. The heat from the combustion provides a high temperature hot side heat source for the thermoelectric modules and the fluid of the circulating hot fluid system provides the cold side heat sink for the thermoelectric modules. Electric power produced by the thermoelectric modules powers a motor driving a pump which circulates the circulating hot fluid. In a preferred embodiment low cost, high temperature thermoelectric modules are provided which comprise thermoelectric elements installed in injection molded eggcrates. The thermoelectric modules are held in close contact with the hot side heat exchanger and the cold side heat sink with a spring force such as that provided by Belville springs. The eggcrate is molded from a high temperature plastic with ridges provided for extra strength and tapered walls to permit ease of installation of the thermoelectric elements and stop tabs assure correct positioning of the elements. Electrical connections at hot and cold surfaces of the modules are preferably made by thermal spraying metallized coatings on the surfaces and then surface finishing the module to expose the walls of the eggcrate.

BRIEF DESCRIPTION OF THE DRAWINGS

FIG. 11 shows a section of an eggcrate.

DETAILED DESCRIPTION OF PREFERRED EMBODIMENTS

Preferred embodiments of the present invention may be described by reference to the figures.

First Preferred Embodiment

Furnace Design

Figure 20:
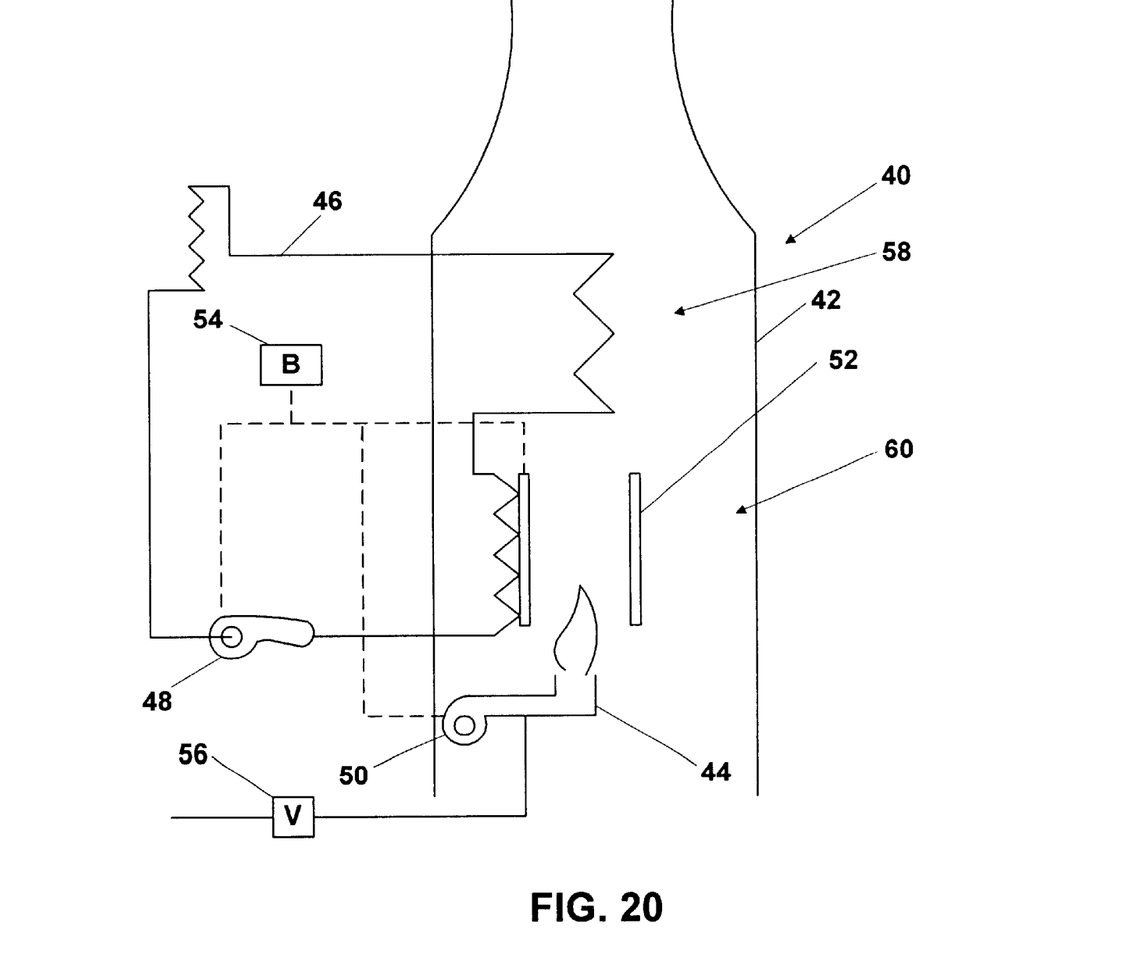
FIG. 20 is a detailed drawing of a preferred embodiment of the present invention.
Figure 21:
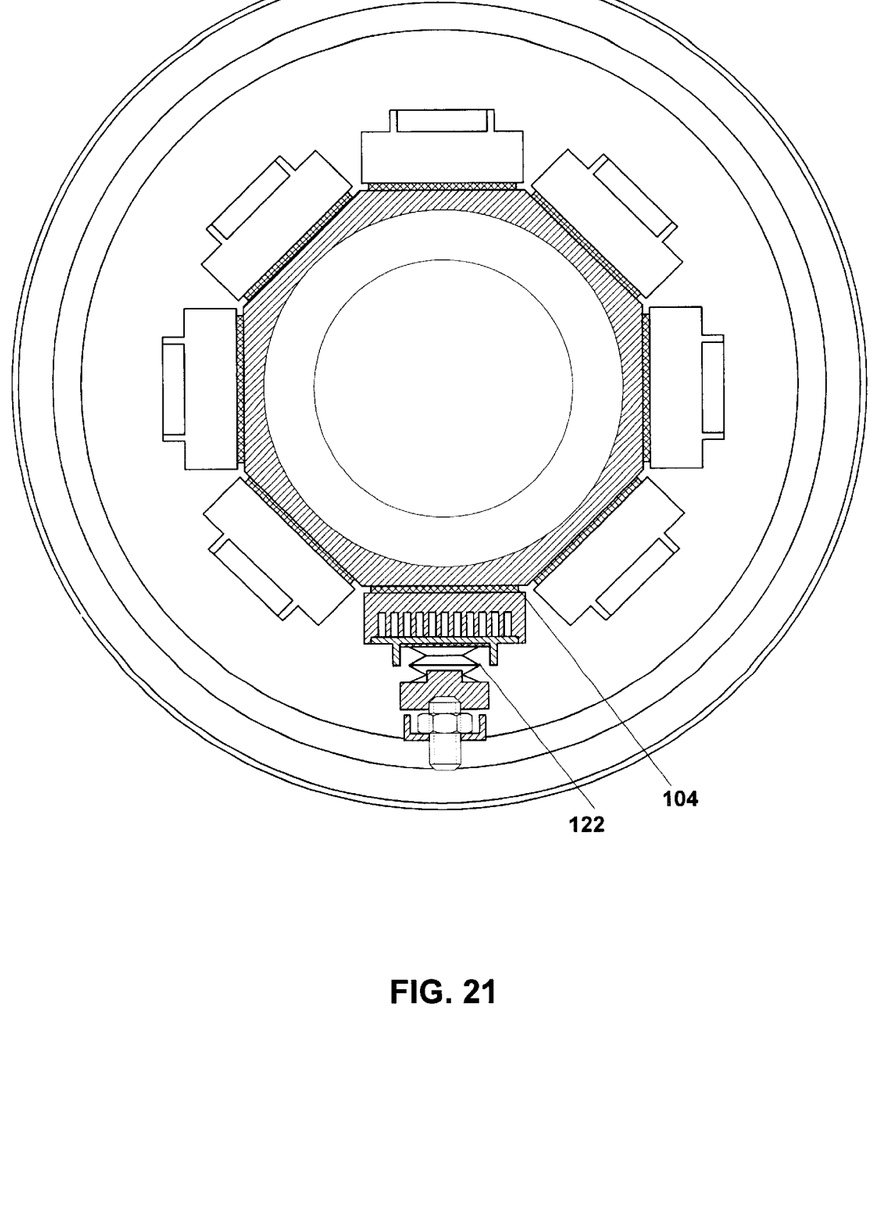
FIG. 21 is FIG. 5 from U.S. Pat. No. 5,625,245 with reference numbers increased by 100.

A first preferred embodiment of the present invention fabricated and tested by Applicants is shown in FIG. 20. A furnace 40 is comprised of a chamber 42 in which a natural gas burner 44 provides a heat source which heats water circulated through pipes 46 by water pump 48. Combustion air is provided by blower 50. An array of thermoelectric modules 52 are arranged so that the hot sides of the modules are heated by the heat provided by burner 44 and cooled by the circulating water in pipes 46. These modules provide DC electric power to charge battery 54 and to operate pump 48, blower 50 and gas solenoid control valves 56.

Figure 12:
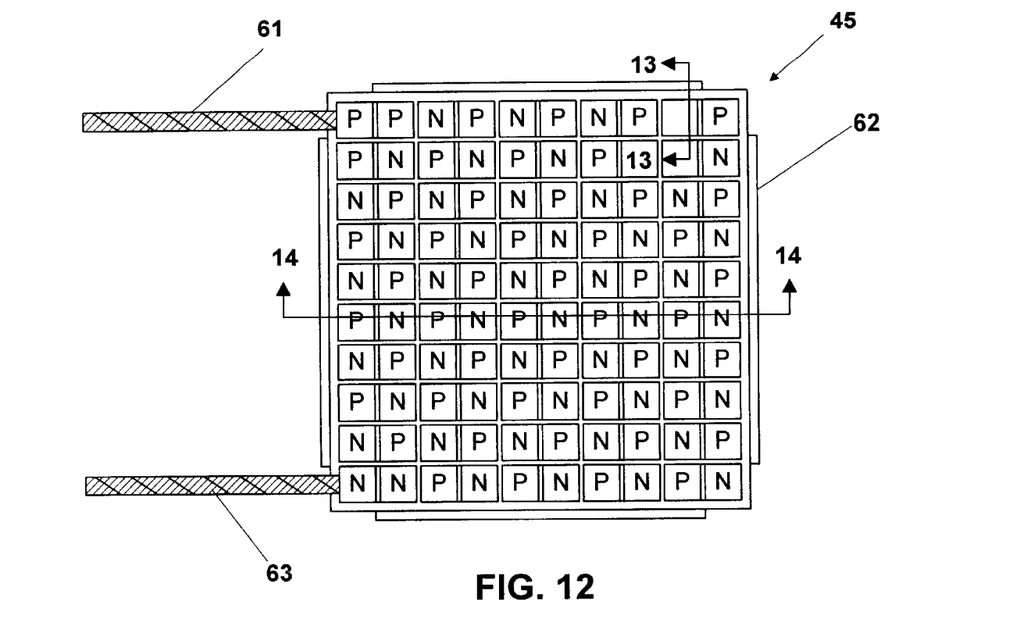
FIGS. 12 and 14 show a preferred element arrangement.

The upper stage 58 of furnace 40 is a modified 50,000 Btu/h (15 kW) compact, natural gas fired heater which is used as a heat exchanger only. The burners were removed and discarded and most of the unit's gas controls and safety features were also removed but re-installed as the final self-powered furnace controls. The thermoelectric stage 60 is a concentric assembly of a central steel heat receiver surrounded by an array of 18 bismouth-telluride alloy thermoelectric modules as shown in FIG. 12 and described below. The thermoelectric modules are mounted in essentially the same manner as described in detail in U.S. Pat. No. 5,625,245 issued to one of the Applicants, Bass, on Apr. 29, 1997. That patent is incorporated herein by reference. The differences are that in this embodiment the structure is hexagonal instead of octagonal and only 6 sets of three modules are used instead of 24 sets of three modules. In the present invention only about 185 Watts were needed as compared to about 1,000 Watts needed for the embodiment of the invention described in the '245 patent. The exit end of the central cavity of this generator interfaces with a hole cut in the bottom of the upper stage. Good thermal contact is assured with the use compression elements including Belville spring stacks 122 as described in the '245 patent. The thermoelectric module is designated as 104.

The heat source used in this embodiment is a nominal 50,000 Btu/h (15 kW) ceramic fiber burner 3 inches (76 mm) in diameter and 7.3 inches (185 mm) long inserted within the central cavity of the thermoelectric stage. Natural gas and air are mixed in a venturi. The air is supplied by a DC ultra-efficient, small high pressure blower rated at 7 Watts.

Operation

The controls of the furnace are the same as on a standard prior art furnace; however, of the interlocks on the standard unit, the "roll-out" switch was eliminated. It could be eliminated because forced air intake was provided for this embodiment. An interlock consisting of a pressure switch on the combustion air blower exit has been added to ensure that the main gas shuts off for any event that disables power to the air blower.

A delay timer was added in the power relays for the water pump and combustion air blower. The timer allows the pump and fan to continue operation after the main gas is shut off. This delay was added for two purposes. On the water side it is necessary to continue cooling the thermoelectric generator because of its thermal inertia. On the gas side it is provided to clear unburned gas from the system. In this embodiment the the blower has a DC motor that operates at 24 volts. This embodiment comprises an inverter to produce 115 volt 60 Hz power so that the prior art water pump and controls could be used. A better arrangement would be to use DC controls and a DC water pump.

Test Results

Actual test results are as follows:

| | |
|---|---|
| Input, Natural Gas | 0.7 cfm (1.2 m³/h) |
| Thermal Power | 44,100 Btu/h (12.9 kW) |
| @1030 Btu/cu ft (38.4 MJ/m³) | |
| Thermal Output | 37,500 Btu/h (11.0 kW) |
| Of which transferred: | |
| in thermoelectric stage | 43% |
| in upper stage | 57% |
| Water Inlet Temperature | 167 degrees F. (75 C.) |
| Water Outlet Temperature | 176 degrees F. (80 C.) |
| Electrical Output, gross | 109 W |
| System Voltage | 13 volts |
| Power Utilized: | |
| Blower | 4 W |
| Inverter Loss | 1 W |
| Gas Control | 24 W |
| Water Pump | 80 W |
| Efficiency | 86% |
| [(Thermal Power + Electric Power)/Input Power | |

The unit was integrated into a computer controlled diagnostic system. Test were run over a 1½ month period to validate performance, and an overall heating efficiency of 85% was determined. Daily cyclic operation was imposed in a "household simulation mode". The unit performed very well. At the highest return water temperature (i.e., about 176 degrees F) this prototype was not quite self powering. This issue could be easily eliminated by adding a few additional or using more efficient electrical equipment. The high temperature side of the thermoelectric modules was about 543 degrees F (300 degrees C).

Thermoelectric Modules

Following is a description to a preferred process for fabricating an eggcrate type thermoelectric modules 45 for use in the thermoelectric generator discussed above.

Injection Molded Eggcrate

Figure 15A:
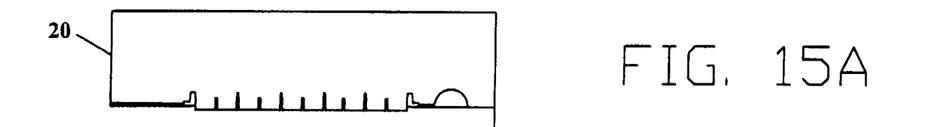
FIGS. 15A and B and 16A and B show a mold for making the eggcrate.
Figure 15B:
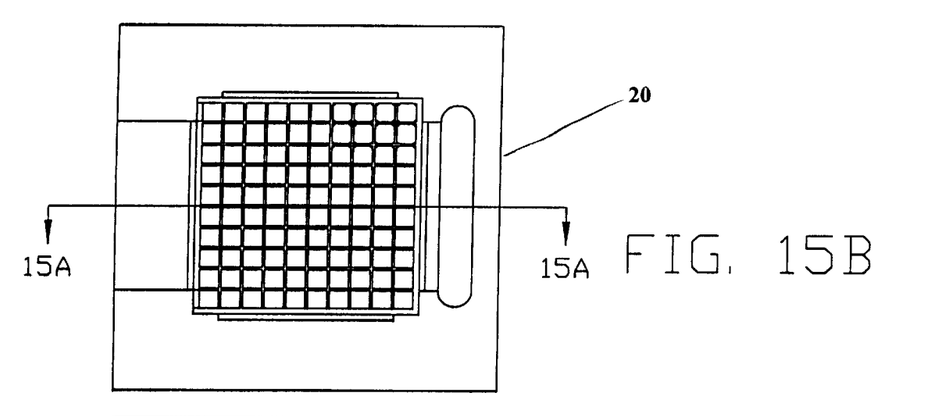
Figure 16A:
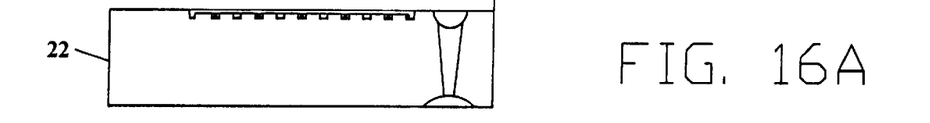
Figure 16B:
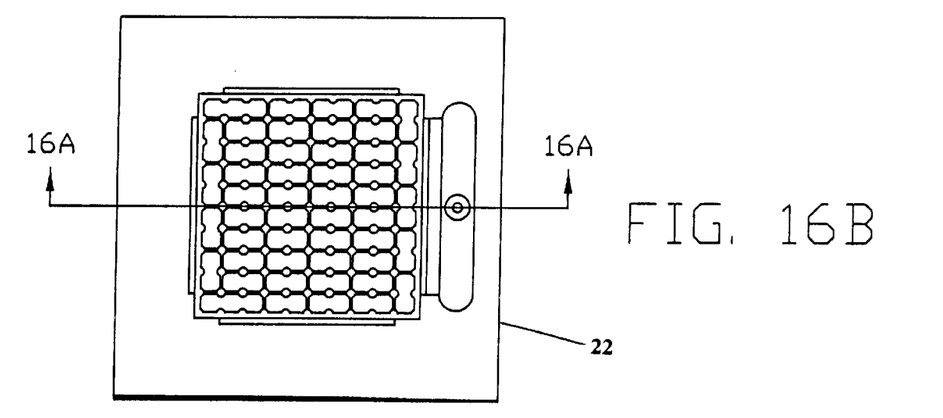
Figure 17:
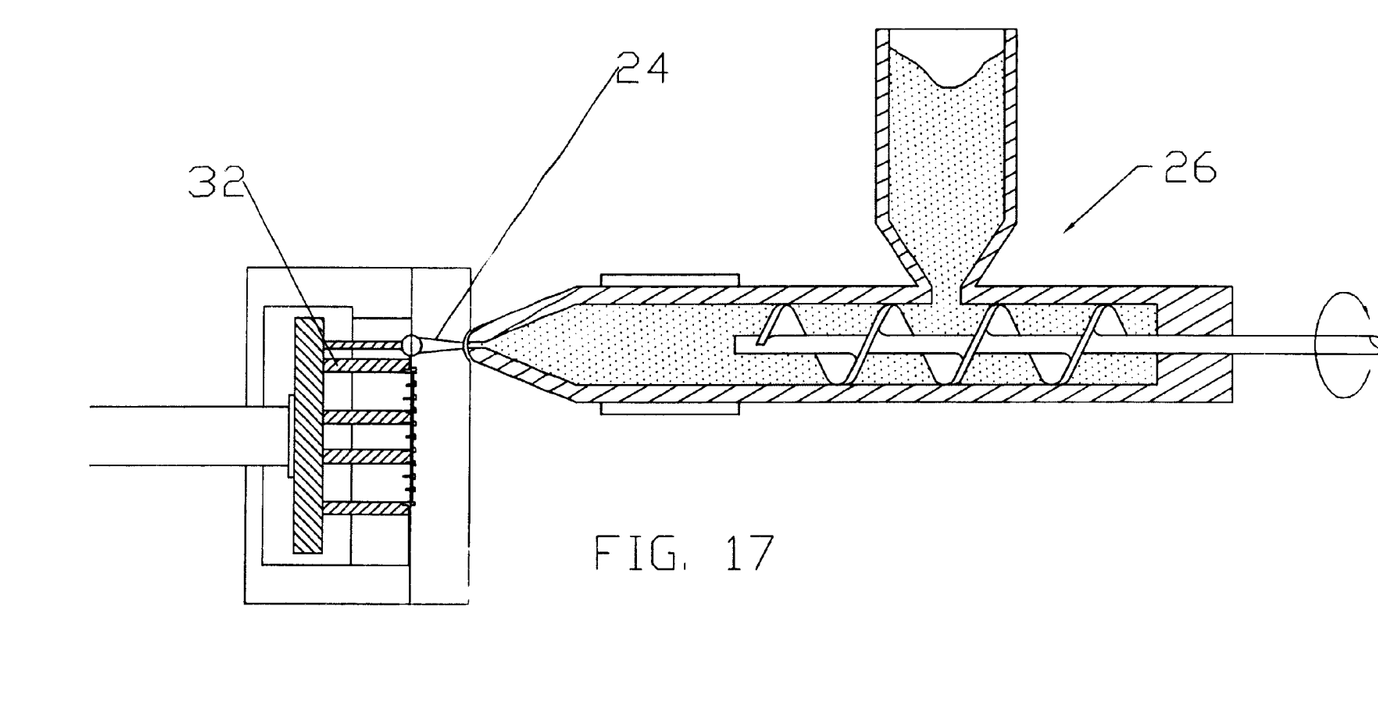
FIG. 17 shows our injection molding process.
Figure 18:
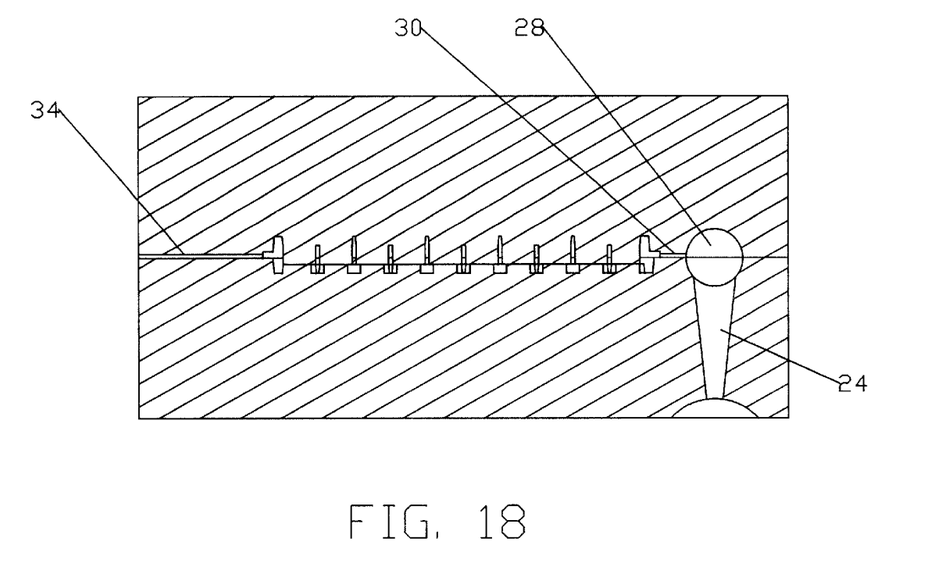
FIG. 18 shows the mold fitted together.

The eggcrate for this preferred embodiment is injection molded using the mold pattern shown in FIGS. 15A and B and 16A and B. FIGS. 15A and B show the bottom of the mold pattern and FIGS. 16A and B show the top of the pattern. The top and bottom are shown in their molding position in FIG. 18. A high temperature thermo plastic, such as the liquid crystal polymer resin, Dupont Zenite, is injected through sprue 24 using well known plastic molding techniques in an injection molding machine 26 as depicted in FIG. 17. The Dupont Zenite plastic is dried at 275 degrees F and the barrel temperatures of the molding machine range from 625 degrees F at the rear to 640 F near the nozzle. Both the bottom mold and the top mold are maintained at a temperature of about 200 degrees F. Zenite melts at about 550 degrees F. In the usual manner the fluid plastic passes through sprue 24, runner 28, and gate 30 into the mold cavity. The vent is shown at 34 in FIG. 18. The finished part is ejected by injection pins 32 as shown in FIG. 17. Initial production runs made by applicants supplier have produced excellent eggcrates at a rate of about 50 eggcrates per hour. This rate can easily be increased to 200 eggcrates per hour for one worker and ultimately the process can be completely automated. This compares to a one worker production rate of about 3 eggcrates per hour with the prior art method of assembling thermoelectric module eggcrates from appropriately slotted layers of insulating materials.

Figure 1A:
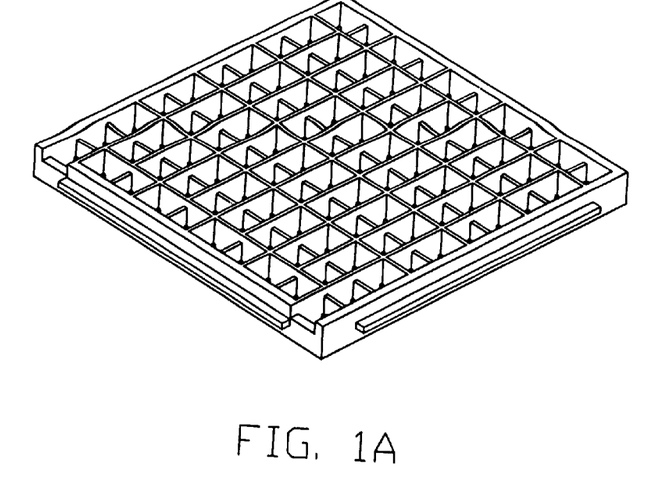
FIGS. 1A and B are two views of an eggcrate according to the present invention.
Figure 10:
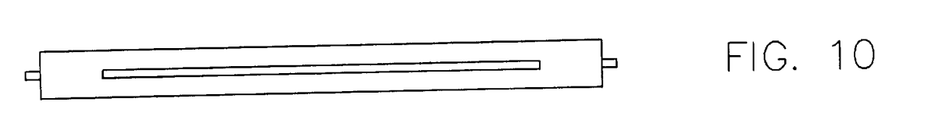
FIG. 10 show an end view.
Figure 11:
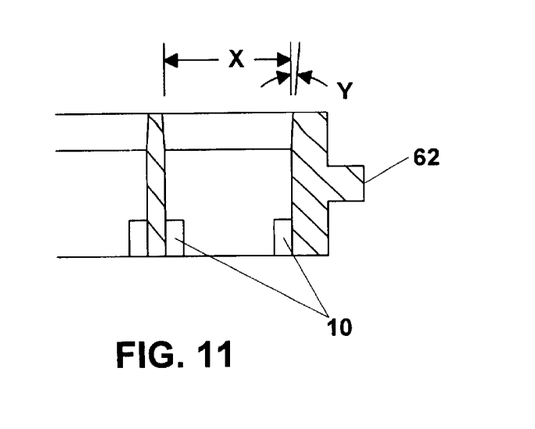

The completed injection molded eggcrate is shown in FIG. 1A. This embodiment contains boxes (spaces) for 100 thermoelectric elements. The dimension of the elements are 5.1 mm×5.1 mm×3.0 mm. The dimension of the spaces at the bottom of the eggcrate are 5.1 mm×5.1 mm. A top view of the eggcrate is shown in FIG. 1. FIGS. 2 through 9 show various sections through the eggcrate. FIG. 10 is a side view and FIG. 11 is a sectional view which shows an expanded view of one of the boxes created by the eggcrate. Note that the upper part of the walls of the box is tapered 5 degrees as shown at Y in FIG. 11. In this embodiment the straight part of the walls of the box forms a 0.2 inch square as shown at X in FIG. 11. This dimension is held to a tolerance of plus 0.001 inch to provide a tight fit for thermoelectric elements which are 0.200 inch square with a tolerance of minus 0.001. Note that a support ridge 62 as shown in FIGS. 11 and 12 is provided around the boundary of the eggcrate at the midplane between the two surface planes of the eggcrate. This support ridge provides extra strength for the eggcrate and is utilized during subsequent stages of module fabrication and can be useful in mounting the completed module for use.

Figure 1B:
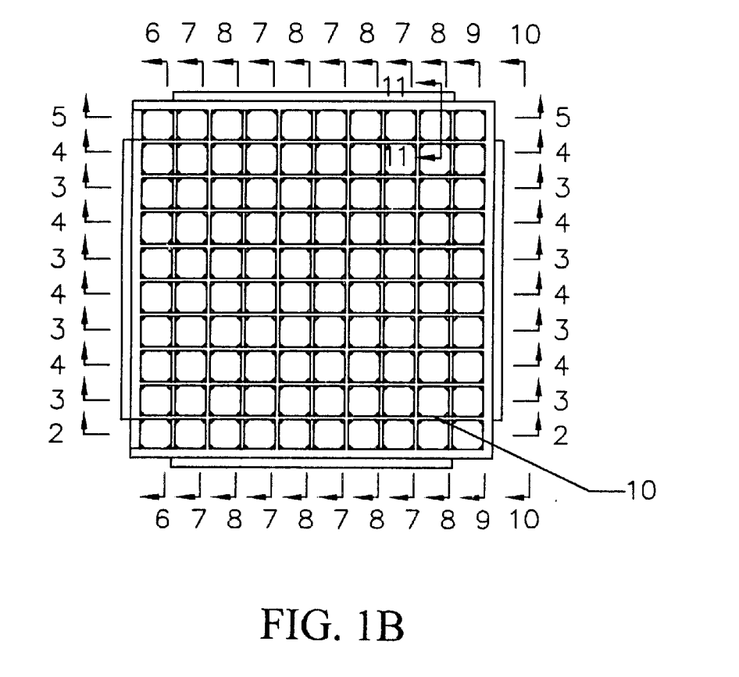
Figures 2, 3:
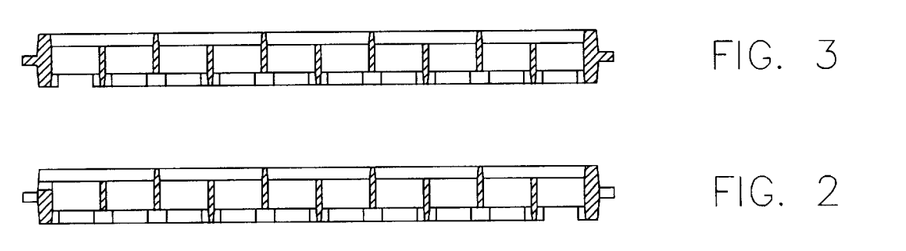
FIGS. 2 through 9 and 11 are section views of the above eggcrate.
Figure 4:
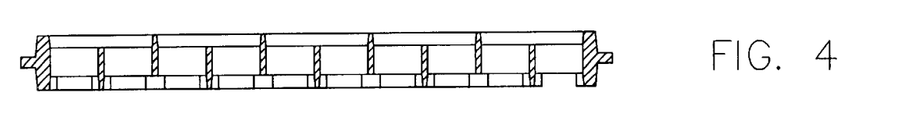
Figure 5:
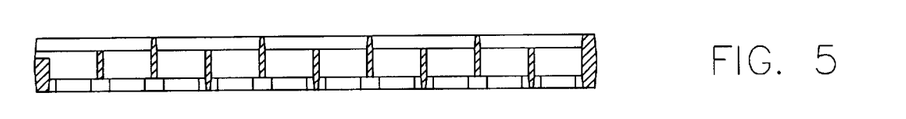
Figure 6:
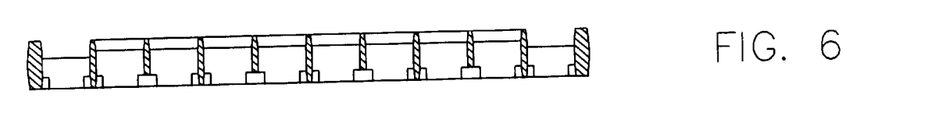
Figure 7:
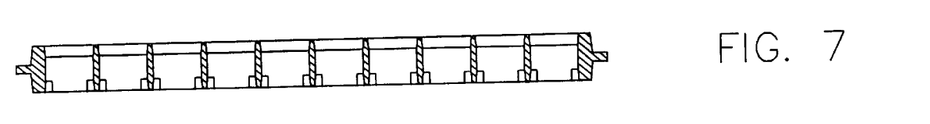
Figure 8:
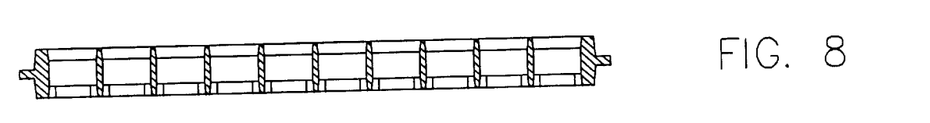
Figure 9:
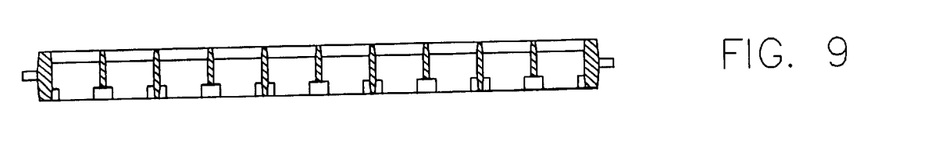
Figure 13:
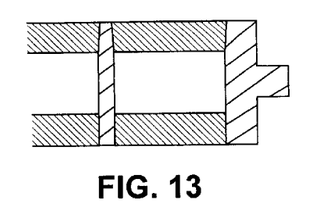
FIG. 13 shows an enlarged view of a portion of a cross section of a module showing parts of the eggcrate, the elements and metal coatings.
Figure 14:
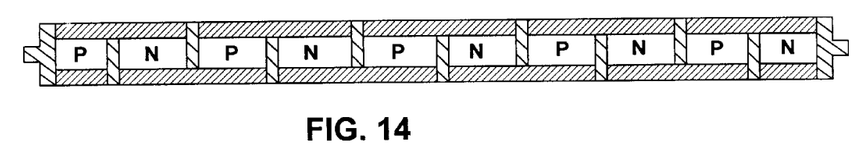
Figure 19A:
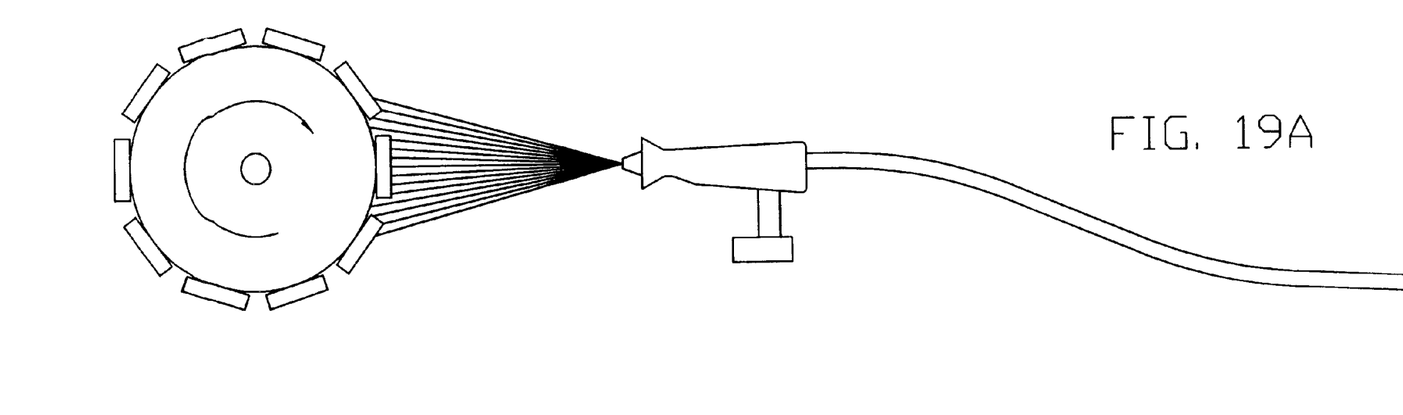
FIG. 19 shows our metallizing process.
Figure 19B:
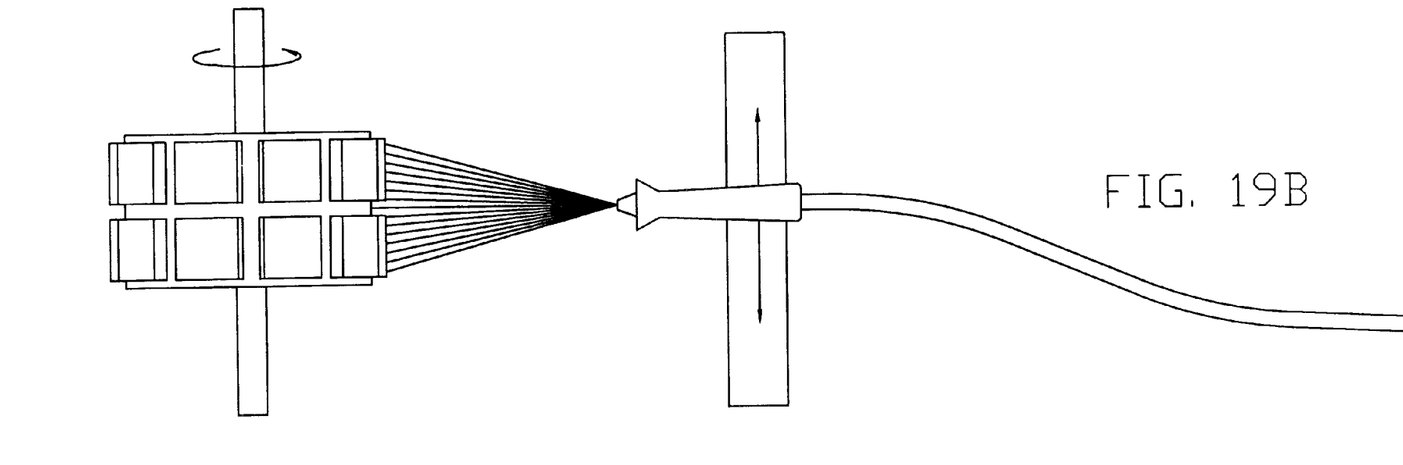

FIG. 12 shows a top view of the eggcrate with the locations indicated for the P and N elements. The elements are placed in these locations with the installer assuring that each element rest firmly against stops 10 as shown in FIGS. 1B and 11. Conductor material is then sprayed on the top and bottom of the eggcrate as shown in FIGS. 19A and 19B, and then the conductor material at the tops and bottoms are ground down until the tops of all insulator surfaces are cleared of conductor material. A preferred procedure for loading the eggcrate is discussed in detail below. FIGS. 13 and 14 show examples of sections of the finished product at location 13—13 and 14—14 as shown in FIG. 12. Note in FIG. 14 how the effect is to connect all the thermoelectric elements in series electrically. In this particular section the hot surface is on the top and the electron flow is from left to right.

Thermoelectric Elements

Thermoelectric elements with dimensions of 5.1 mm×5.1 mm×3.0 mm are prepared using any of several well known techniques such as those described in Thermoelectric Materials edited by Sittig, published in 1970 by Noyes Data Corporation, Park Ridge, N.J. Preferred materials are Lead Telluride for high temperature applications and Bismuth Telluride for low temperature applications. These elements may also be purchased commercially from suppliers such as Melcor Corporation with offices in Trenton, N.J. One half of the elements should be "n" elements and one half "p" elements.

Loading the Eggcrates

The "p" elements are positioned in the appropriate boxes of the egg create as shown in FIG. 12. The element should be snug against the stop. The "n" elements are also positioned in the appropriate boxes of the egg crate as shown in FIG. 12. Each element should be snug against the stop. A 2 inch long ⅛ inch wide copper mesh wire lead is inserted at positions 61 and 63 as shown in FIG. 12. At the location of the junction of the leads to the module we provide two "p" elements and two "n" elements side by side and electrically in parallel for extra support for the leads to reduce the likelihood that the leads would break loose.

Metallizing the Hot and Cold Surfaces

Using spring loaded clamps, we clamp a number of modules to a rotatable mandrel. In FIGS. 19A and B we show 20 modules clamped to such a mandrel. We then grit blast the module/element surface with 180–240 grit A1203 to a uniform matte finish with the mandrel rotating at 55 rpm. Then we use compressed air to blow the module/element surface clean. Next we apply a metal thermal spray coating to the exposed surface using a thermal spray coating system as shown in FIGS. 19A and B. These spray techniques are well known. Further specific details are provided in Metals Handbook, Ninth Edition, published by the American Society for Metals. A variety of metals can be used to coat the surface. Our preferred coating is a two-layer coating comprising a first approximately 0.006 inch thick coating of molybdenum and a second approximately 0.06 inch thick coating of aluminum. Both coatings are applied using the system shown in FIGS. 19A and B with the mandrel rotating at 55 rpm and the spray gun running back and forth at speeds of about 0.2 inch per second. After the first surface is coated we remount the modules to expose the unsprayed surface and repeat the above described process with the second coating.

Grind the Module Surfaces

The surfaces must be ground down to expose the eggcrate walls. To do this we position a sprayed module in the mounting chuck of a surface finishing machine. We reduce the surface of the module to the appropriate height as measured from eggcrate tab 62 shown in FIGS. 11 and 12. We then remove the module from the chuck, reverse the module and reduce the opposite face of the module until the module surface is the appropriate height from the egg crate tab.

Inspection

We heat the hot surface of the module to 250 C and cool the cold side of the module to 50 C. We then measure the open circuit voltage of the module. It should be about 3.2 volts with bismuth telluride elements. We then apply an electrical load to the module until the voltage drops to 1.6 volts and measure the current. We calculate the power produced by the module as $P=I\times V$. The power level should be at least 13 watts for the bismuth telluride elements.

Performance of the Unit

The total output of the eight thermoelectric modules connected in series, with a hot side temperature of 375 degrees F and a cold side temperature of about 65 degrees F, will be about 62 watts at about 12 volts. Additional power and higher voltages can be obtained by adding additional thermoelectric generator units. As indicated only a very small percentage of available waste energy of the dehydration plant was utilized in the above described arrangement.

Second Preferred Embodiment

Applicant's have fabricated a second preferred embodiment of the present invention to confirm the practicality of the invention. In this second preferred embodiment the combustion gasses were down flowing in a forced convection system by a suction fan. In this case 10 of the above described thermoelectric modules were sandwiched between a water cooled cold plate and a finned hot plate which was mounted opposite the burner of a hydronic heater supplied by Intergas Ltd with offices in Holland. Otherwise the second preferred embodiment is similar to the first preferred embodiment.

The foregoing description of the present invention has been presented for the purpose of illustration and is not intended to limit the invention to the precise form disclosed. It is understood that many modifications and changes may be effected by those skilled in the art. For example, thermoelectric modules other than the one described could be utilized in which case details of the heat exchanger and compression elements would probably need to be modified appropriately. It is feasible to make modules with many more thermoelectric elements in which case a single thermoelectric module may be sufficient to provide the required voltage. Other well known methods of holding the thermoelectric elements in good thermal contact with the heat exchangers could be used. When sales are high enough to justify it, Applicants plan to manufacture the heat exchangers using aluminum castings. This should greatly reduce the cost. As to the thermoelectric modules, many other materials besides Zenite can be used for injection molded eggcrates. These include Xydar (manufactured by Amaco which is substantially equivalent to Zenite), Rytron produced by Philips, polyethylene, silicones, teflons, and many others. Zenite was primarily selected because of its superior properties (i.e., melting point, thermal stability, etc.) at higher temperatures. Also it should be possible to use a ceramic material in the form of a "slip". (This is the term used for describing a fine ceramic material suspended in a liquid.) After molding, the liquid is removed by drying and/or the mold (typically plaster of paris) absorbing the liquid. The components are then sintered to give them strength. Zenite, in fact, contains a fine glass powder filler to reduce material costs and control other material properties. This filler could be some other material such as carbon or come chopped fibers made from fiber glass, graphite fibers, etc. Other moldable materials which could be used are organic precursors that transform from the organic to the inorganic state when heated. Materials of this nature would be very desirable for higher temperature eggcrates that would be used with high temperature thermoelectric materials such as PbTe and SiGe which operate at temperatures greater than 350° C. which is typically an upper limit on most organic materials. These materials would allow the eggcrate to be loaded to higher values at temperatures where organic materials typically lose their strength. Phosphate and silicate pastes and cements might also be used for the eggcrate material for high temperature applications. These materials could be formed into eqqcrates using silk-screening techniques used in the electronics industry. Accordingly it is intended by the appended claims to cover all modifications and changes as fall within the true spirit and scope of the invention.

We claim:

1. A self powered furnace comprising:
   1) at least one hot side heat exchanger heated by a combusting fuel,
   2) at least one cold side heat sink cooled by a circulating fluid,
   3) at least one thermoelectric module positioned between said at least one hot side heat exchanger and said at least one cold side heat exchanger to produce electric current, said at least one thermoelectric module defining a hot surface and a cold surface and comprising:
      a) a crate having the form of an eggcrate defining a plurality of thermoelectric element spaces,
      b) a plurality of p-type thermoelectric elements,
      c) a plurality of n-type thermoelectric elements, said p-type and said n-type thermoelectric elements being positioned in said thermoelectric element spaces,
      d) a metallized coating on said cold surface connecting p-type thermoelectric elements to n-type thermoelectric elements on said cold surface,
      e) a metallized coating on said hot surface connecting p-type thermoelectric elements to n-type thermoelectric elements on said hot surface, the position of said p-type and said n-type elements, the configuration of said eggcrate and said metallized coatings being effective to cause a plurality of said thermoelectric elements to be connected electrically in series, and
   4) a motor driving a pump to circulate said circulating fluid, said motor being powered by electric power provided by said at least one thermoelectric module.

2. A self powered furnace as in claim 1 and further comprising electric controls to control said combustion fluid, said controls being powered by electric power pjrovided by said at least one thermoelectric module.

3. A self powered furnace as in claim 1 and further comprising a compression means for maintaining close contact between said module and said heat exchangers.

4. A self powered furnace as in claim 3 wherein said compression means comprises at least one Belville spring stack.

5. A self powered furnace as in claim 1 wherein said crate is an injection molded crate.

6. A self powered furnace as in claim 5 wherein said injection molded crate is comprised of high temperature plastic.

7. A self powered furnace as in claim 6 wherein said high temperature plastic is a liquid crystal plastic.

8. A self powered furnace as in claim 7 wherein said high temperature liquid crystal plastic is Dupont Zenite.

9. A self powered furnace as in claim 5 wherein said high temperature plastic is a silicone plastic.

10. A self powered furnace as in claim 5 wherein said injection molded eggcrate is comprised of an electrically insulating ceramic material.

11. A self powered furnace as in claim 5 wherein said metallized coatings comprise a layer of molybdenum and a layer of aluminum.

12. A self powered furnace as in claim 5 wherein said metallized coatings comprise a layer of a nickel-aluminum alloy.

13. A self powered furnace as in claim 1 wherein said circulating fluid is water.

14. A self powered furnace as in claim 5 wherein said crate contains walls which are tapered to permit easy installation of said thermoelectric elements.

15. A self powered furnace as in claim 8 wherein each of said plurality of thermoelectric spaces define four walls and four intersections at the intersections of said walls and further comprising a stop means at at least three of said intersections for limiting the depth of insertion of said thermoelectric elements.

16. A self powered furnace as in claim 1 said hot and cold surfaces each defining a surface plane and a surface boundary and further comprising at least one molded support ridge which is outside said surface boundary and between said surface planes.

17. A self powered furnace as in claim 1 wherein said thermoelectric elements comprise extruded elements.

18. A self powered furnace as in claim 1 wherein said metallized coatings comprise a layer of molybdenum and a layer of aluminum.

19. A self powered furnace as in claim 1 wherein said metallized coatings comprise a layer of a nickel-aluminum alloy.

* * * * *